US012032285B2

(12) United States Patent
Lou et al.

(10) Patent No.: US 12,032,285 B2
(45) Date of Patent: Jul. 9, 2024

(54) ADAPTIVE FEEDFORWARD AND FEEDBACK CONTROL FOR CONTROLLED VISCOSITY ALIGNMENT AND FIELD-TO-FIELD RELATED FRICTION VARIATION

(71) Applicant: CANON KABUSHIKI KAISHA, Tokyo (JP)

(72) Inventors: Mingji Lou, Cedar Park, TX (US); Takahiro Yoshida, Austin, TX (US); Steven T. Jenkins, Round Rock, TX (US); Kenichi Kobayashi, Utsunomiya (JP); Tatsuya Arakawa, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/166,924

(22) Filed: Feb. 9, 2023

(65) Prior Publication Data
US 2023/0185189 A1 Jun. 15, 2023

Related U.S. Application Data

(62) Division of application No. 17/183,895, filed on Feb. 24, 2021, now Pat. No. 11,604,408.

(51) Int. Cl.
*G03F 7/00* (2006.01)
(52) U.S. Cl.
CPC .................. *G03F 7/0002* (2013.01)
(58) Field of Classification Search
CPC .................................................. G03F 7/0002
See application file for complete search history.

(56) References Cited

U.S. PATENT DOCUMENTS

| | | | | |
|---|---|---|---|---|
| 7,719,782 | B1* | 5/2010 | Bates | G11B 15/689 360/69 |
| 8,953,278 | B1* | 2/2015 | Zhou | G11B 5/59694 360/77.04 |
| 9,053,724 | B1* | 6/2015 | Chahwan | G11B 5/59694 |
| 9,111,575 | B1* | 8/2015 | Zhou | G11B 19/28 |
| 9,378,722 | B2* | 6/2016 | Butler | G03B 27/42 |
| 2003/0213382 | A1* | 11/2003 | Kendale | G03F 7/0002 101/41 |
| 2019/0358863 | A1* | 11/2019 | Kimura | G03F 9/7042 |

FOREIGN PATENT DOCUMENTS

TW 201641257 A 12/2016

OTHER PUBLICATIONS

Chassaing, R, "DSP Applications Using C and the TMS320C6x DSK", Chapters 6 and 7, 2002, pp. 182-238.*

* cited by examiner

*Primary Examiner* — Alex A Rolland
(74) *Attorney, Agent, or Firm* — Canon U.S.A., Inc., IP Division (57) ABSTRACT

A method and system for imprinting a substrate supported on a moveable stage is provided and includes contacting a liquid resist on the substrate with a template and aligning the substrate with the template using a feedback-feedforward control process with a first set of control parameters. Calibration data is obtained and the viscosity of at least a portion of the resist is increased. The substrate is then with the template using the feedback-feedforward control process with a second set of control parameters after the viscosity of the resist has increased, the second set of control parameters are determined based on the calibration data and the resist is cured under the template.

8 Claims, 5 Drawing Sheets

ADAPTIVE FEEDFORWARD AND FEEDBACK CONTROL FOR CONTROLLED VISCOSITY ALIGNMENT AND FIELD-TO-FIELD RELATED FRICTION VARIATION

CROSS-REFERENCE TO RELATED APPLICATIONS

This application is a Divisional Application of U.S. patent application Ser. No. 17/183,895 filed Feb. 24, 2021. The disclosures of the above-named application is hereby incorporated by reference herein in its entirety.

TECHNICAL FIELD

The disclosure relates to alignment control in nanoimprint lithography, more specifically to compensating for vibration introduced during the alignment process.

BACKGROUND

In nanoimprint lithography, techniques for field to field alignment have been used to achieve nanometer level overlay accuracy. In some examples, an initial alignment error between an imprint template and a corresponding field on a substrate can be corrected by moving the template relative to the substrate (e.g., a wafer). However, fast and consistent alignment for nanoimprint lithography is a challenge. More specifically, thin-liquid friction and variation of initial status are two major difficulties. This includes current schemes having difficulty handling different RLT (residual layer thickness of curable liquid between the template and the substrate), location, and transition process. In particular, the dispensing of the RLT, the alignment motion and the lithography environment itself generate vibrations that result in unacceptable levels of oscillation. Further, because of these different instances of vibration are introduced, the oscillation level cannot be zeroed out by natural friction. These issues consistently impact the yield and efficiency of mass production and it is therefore desirous for them to be corrected.

SUMMARY

According to present disclosure, a method and system for imprinting a substrate supported on a moveable stage is provided and includes contacting a liquid resist on the substrate with a template and aligning the substrate with the template using a feedback-feedforward control process with a first set of control parameters. Calibration data is obtained and the viscosity of at least a portion of the resist is increased. The substrate is then with the template using the feedback-feedforward control process with a second set of control parameters after the viscosity of the resist has increased, the second set of control parameters are determined based on the calibration data and the resist is cured under the template.

According to another embodiment, the calibration data is generated while aligning the substrate with the template using the feedback-feedforward control process with the first set of control parameters. In another embodiment, the first set of control parameters include a frequency component and the second set of control parameters represent an updated frequency component generated based on the calibration data, and the substrate is aligned with the template based on the updated frequency component in the second set of control parameters.

Moreover, in another embodiment, the calibration data is generated by receiving a set of alignment controls that vary with time, transforming the set of alignment controls into a set of alignment state values that vary with a first state variable, receiving a set of position estimations that vary with time, transforming the set of position estimations into a set of position state values that vary with the first state variable, and generating one or more covariance values.

In one embodiment, the set of alignment controls include (a) one or more adaptive functions used in the feedback-feedforward control process, (b) one or more output control signals used in controlling the position of the stage, and (c) an energy controller signal controlling one or more parameters of the energy being applied to increase the viscosity of the resist. In one embodiment, the set of position estimations includes a first position signal representing a mark on the template relative to a mark on the substrate and a second position signal representing a position of the stage.

In another embodiment, generating the calibration matrix further comprises obtaining a second set of alignment controls and a second set of position estimations, wherein the second set of alignment controls and the second set of position estimations are based on previously performed imprint processes. In a further embodiment, the generated covariance values are used to generate the second set of control parameters by modifying one or more control functions applied during the feedback-feedforward control process.

According to another aspect of the disclosure an imprint lithography system for controlling alignment of an imprint lithography template with respect to a substrate is provided. The system includes a stage configured to retain the substrate and which is moveable such that a position of the stage can be modified, a depositor configured to deposit resist on the substrate, an energy controller configured to apply energy to the resist to increase viscosity thereof and a sensor configured to sense a position of the substrate relative to the imprint lithography template. At least a controller in communication with the stage, the sensor and the energy controller is configured to, based on the substrate having a liquid imprint resist contacting the template, align the substrate with the template using a feedback-feedforward control process with a first set of control parameters, obtain calibration data, increase the viscosity of at least a portion of the resist, align the substrate with the template using the feedback-feedforward control process with a second set of control parameters after the viscosity of the resist has increased, wherein the second set of control parameters are determined based on the calibration data; and cure the resist under the template.

According to another aspect of the disclosure, a method of manufacturing articles including using the method of imprinting recited in claim 1 is provided and, the method of manufacturing articles further includes dispensing an imprint resist on the substrate, the imprint resist being a liquid, contacting the imprint resist with the object, the object having a pattern thereon that contacts the imprint resist, and processing the substrate on which the imprint resist has been dispensed so as to manufacture the articles. In another embodiment, processing the substrate further comprises applying energy to the substrate to cure the imprint resist and form a pattern on the substrate that corresponds to the pattern on the object, wherein the method of controlling the movable stage is repeatedly performed while the object is in contact with the imprint resist, such that the object and substrate are aligned prior to the resist being cured by the applied energy.

The details of one or more implementations of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
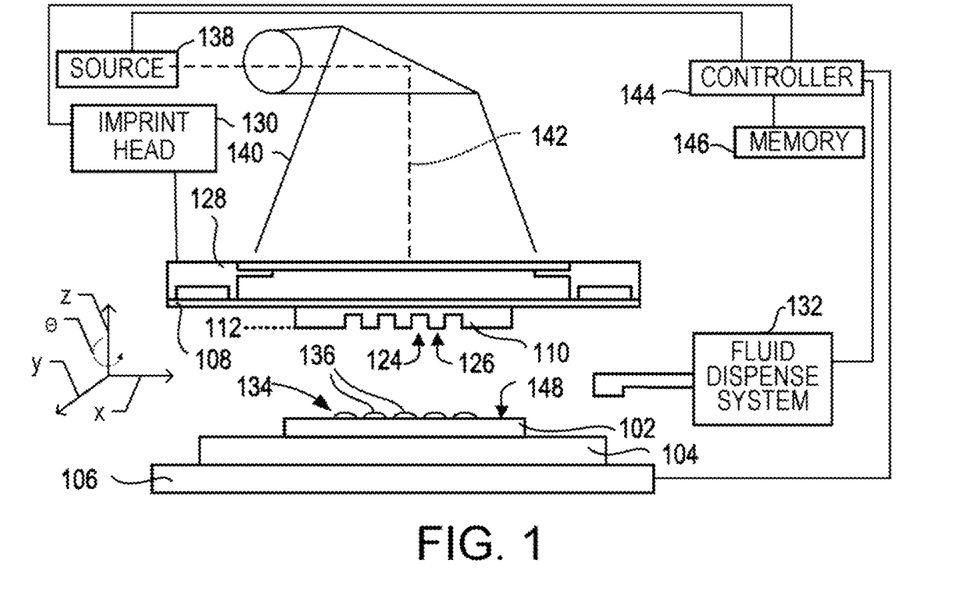
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes as well as rotation (e.g., θ) about the z-axis. In this regard, the stage 106 may refer to an XYθ stage. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 112 includes a plurality of features defined by spaced-apart recesses 124 and protrusions 126. The pattern being formed as described above is for purposes of example only and any type of pattern may be represented on the patterning surface 112. As such, the patterning surface 112 may define any pattern that forms the basis of a pattern to be formed, via imprint processing, on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. In some embodiments, the template chuck 128 may be of the same type as the substrate chuck 104. In other embodiments, the template chuck 128 and substrate chuck may be different types of chucks. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). Translation or rotation of the template 108 with respect to the substrate 102 may also be achieved by translation or rotation of the substrate. In-plane movement of the template 108 also includes increasing or decreasing a compression force on opposite sides of the template (e.g., with a magnification actuator) to increase or decrease dimensions of the template in the X-Y plane of the template. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
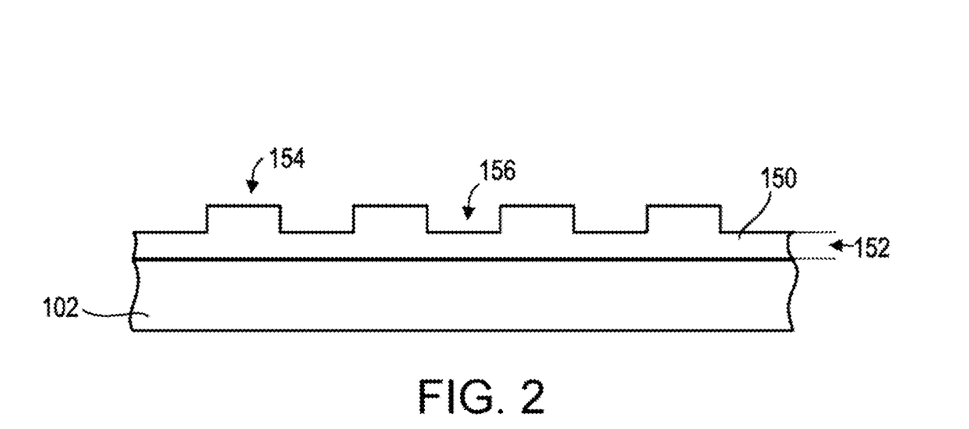
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 112, defining a polymeric patterned layer 150 on the substrate 102. In some examples, the patterned layer 150 includes a residual layer 152 and a plurality of features shown as protrusions 154 and recessions 156, with the protrusions 154 having a thickness t1 and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mesa" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof. Alignment errors may also be caused by the introduction of vibration caused by one or more actions of the imprint lithography process and machinery that executes imprint lithography processes.

Figure 3:
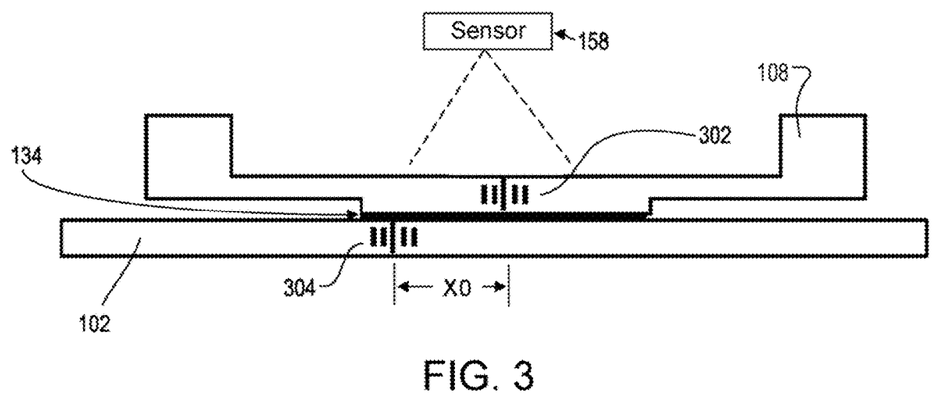
FIG. 3 depicts a side view of a nanoimprint lithography template in contact with a liquid imprint resist on a substrate, showing an initial alignment error X0 between an example pair of alignment marks on the template and the substrate, respectively.

FIG. 3 illustrates a side view of an imprint lithography template 108 in contact with a liquid imprint resist 134 on a substrate 102, showing a first or initial alignment error X0 between an example pair of alignment marks 302 and 304 on the template 108 and the substrate 102, respectively. The alignment error X0 may be measured by an image capturing device such as a sensor 158. In some examples, the sensor 158 includes a TTM alignment instrument configured to detect diffracted light from the alignment marks 302 and 304 in which the diffractive light may pass through the liquid imprint resist 134. The initial alignment error X0 may exceed a tolerable alignment error, which can be less than 10 nm with a repeatability of 1 nm or less, for instance. While the sensor 158 is described as an image capturing device, this is merely exemplary and the image capturing device may include any device able to detect, capture and transmit diffracted light in real-time.

The alignment error X0 may primarily be caused by placement error, rotation error, and/or compliance and hysteresis of the stage 106 (e.g., an XYθ stage), and may include the errors in the x- and y-axes and a rotation about the z-axis (θ). For example, the placement error generally refers to X-Y positioning errors between a template and substrate (that is, translation along the X axis, the Y axis, or both, where the X and Y axes are in the plane of or parallel to the imprinting surface of the template or the substrate, as depicted in FIG. 1). The rotation (θ) error generally refers to the relative orientation error about the Z axis (that is, rotation about the Z axis, where the Z axis is orthogonal to the X-Y plane as depicted in FIG. 1).

Placement errors in which a template alignment mark 302 and a corresponding substrate alignment mark 304 are offset in the X-Y plane may be compensated for by relative movement of the template and the substrate (e.g., by controlled movement of the substrate, the template, or both in the X-Y plane). Rotation errors may be compensated for by altering the relative angle of the template and substrate in the X-Y plane (e.g., by rotation of the substrate, the template, or both).

The present disclosure sets forth a control mechanism for controlling the operation of the imprint system described hereinabove with respect to FIGS. 1-3 to reduce an amount of time it takes for the alignment marks 302 and 304 to converge for proper alignment in order to ensure that the pattern defined on the mesa 110 is successfully imprinted on the substrate 102. In other words, a control algorithm will be described below to bring a reduced error value generically indicated by X0 to be below a predetermined error threshold within a predetermined period of time. Preferably, the outcome will result in a relative distance between the mark on the template to the mark on the substrate being less than a predetermined distance value. However, there has been a certain difficulty in bringing this error value to an acceptable level within an acceptable period of time due to various physical characteristics of both the substrate and the polymer used for imprinting the pattern thereon.

One challenge associated with proper alignment between the substrate and the template relates to vibration that is introduced during the imprinting process which impacts proper alignment. There are various sources for vibration introduced during the imprinting process but it is not always easy to isolate, identify and control the imprint process to correct for these vibrations. Exemplary sources of vibration can include, but are not limited to, the dispensing of the resist onto the substrate, alignment-specific vibration caused by the alignment process and vibration caused by any number of components of the imprint lithography machinery illustrated in FIG. 1.

An exemplary correction mechanism has been developed to minimize certain vibration that could impact alignment. This correction mechanism is known as controlled viscosity alignment (CVA) which reduces vibration by increasing friction between the template and substrate by applying a predetermined amount of direct energy to the polymerizable material deposited by dispensing mechanism onto the substrate. The energy directed at the polymerizable material varies over space and time with both intensity and the optical wavelength. The CVA process has been found to minimize the impact of vibration. However, differing conditions at differing points in the lithography imprint process may result in varying levels and types of vibration. More specifically, vibration variation may be a variation in any one or more of amplitude variation, frequency variation, phase variation and a variation in time it would normally take for variation to die down due to natural friction (dying down envelope). For example, CVA may be able to remove vibration resulting from dispensing of polymerizable material, the environment and alignment motion but the result of the CVA process causes residual vibration which, in some instances, is in a different frequency than the original vibration that was corrected by CVA. In another example, the CVA applied to correct vibration as above but results in frictional uncertainty between template and substrate that may result in friction that causes the alignment process to stall.

In some instances, the variation in vibration after CVA may be related to different residual layer thickness (RLT), current imprint location (e.g. center, edge, partial field) and timing during the alignment motion. These variations directly impact the CVA process which is designed to minimize vibration. The presence of feedback control loops associated with stage encoder and the moiré sensor enables some vibration cancellation actions. However, the other sources of vibration are difficult to identify thus presenting a challenge when attempting to control other components of the imprint lithography process to perform actions that may cancel the additional vibration. As such, it would be particularly advantageous to be able to tune the CVA process to better account for and correct the variable vibration introduced during the imprint lithography process.

Accordingly, a vibration correction algorithm for use in feedforward-feedback control loop that controls an imprint lithography system is provided. This algorithm advantageously considers multiple input signals and multiple output signals generated by one or more sensors of the imprint lithography system and the relationship between these inputs and outputs. These multiple inputs and outputs are used to generate a matrix of calibration data that is used to generate one or more control parameters that, when applied at various points within feedforward-feedback control loop operation, improve the alignment process of the substrate and template by minimizing vibrations that result from the CVA process.

Figure 4:
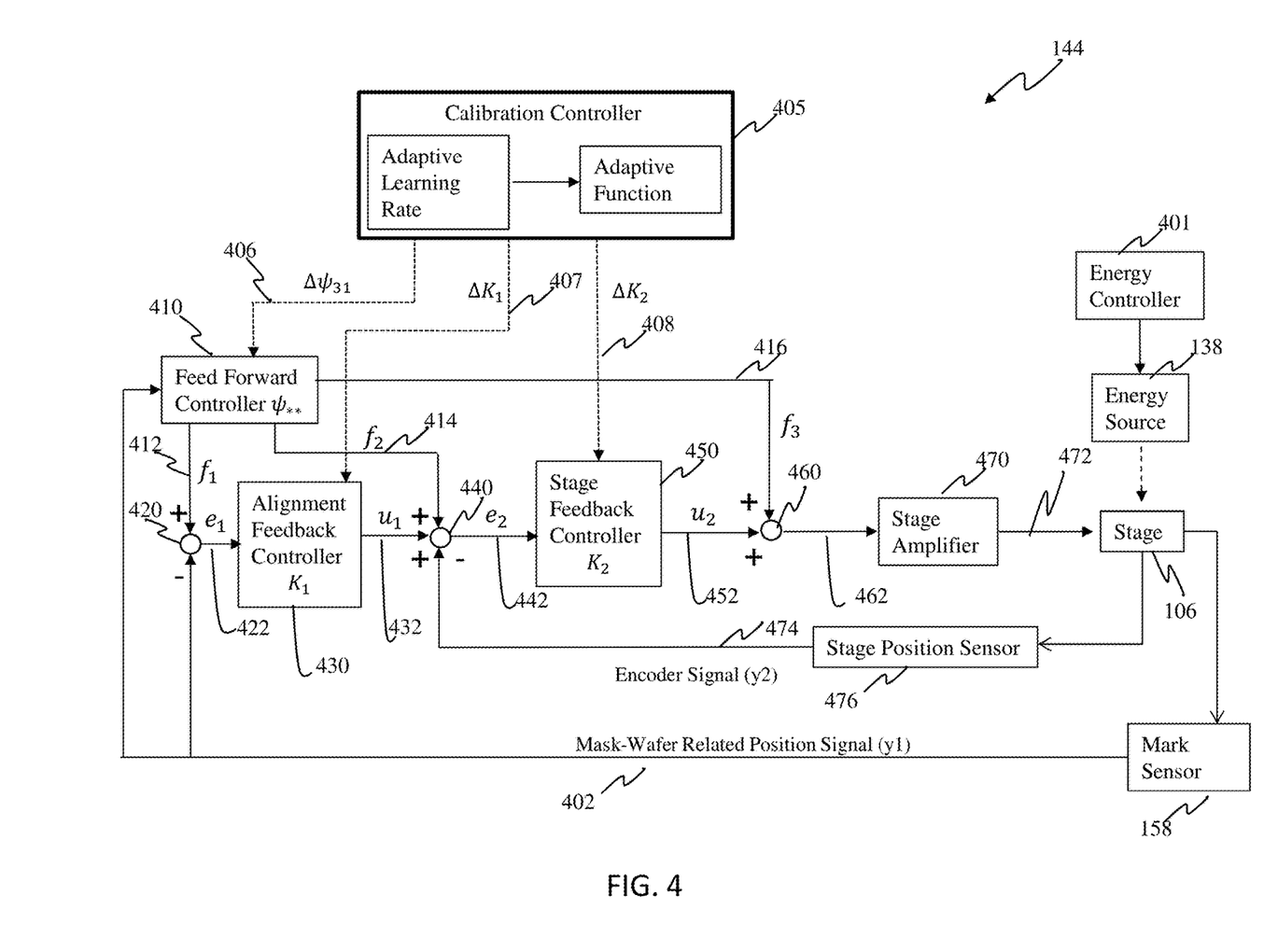
FIG. 4 depicts a block diagram illustrating feedforward and feedback control for use in aligning marks on the template and the substrate.

A block diagram of the feedforward-feedback control loop for the imprint lithography system of FIG. 1 is shown in FIG. 4 An exemplary output of this control loop is a control signal is generated for controlling movement of the stage in the $XY\theta$ directions. The control signal includes one or more parameter values that are translated into electrical signals which are applied to a stage motor (not shown) for moving the stage to a desired target position in order to perform alignment processing between the template and the substrate. By continually monitoring the position information of the stage and substrate relative to the position of the template and using these measurements, the system as described herein successfully reduces vibration generated as a result of the control viscosity alignment process.

FIG. 4 illustrates an example control block diagram. The control system as described herein is shown embodied as part of the controller 144 in the system 100 shown in FIG. 1. The controller 144 includes at least one central processing unit (CPU) and memory and can execute instructions stored in the memory to perform one or more of the described operations and/or functions. The controller 144 is in communication with one or more memories (e.g. RAM and/or ROM) and, in some instances executes stored instructions to perform the one or control operations. In other instances, the controller 144 may temporarily store data in the one or more memories that are used in calculation and generation of the various signals described hereinafter. As such, the controller 144 controls the system 100 of FIG. 1 by using a computer program (one or more series of stored instructions executable by the CPU) and data stored in the RAM and/or ROM. Here, the controller 144 may include (or may be in communication with) one or more dedicated hardware or a graphics processing unit (GPU), which is different from the CPU, and the GPU or the dedicated hardware may perform a part of the processes by the CPU. As an example of the dedicated hardware, there are an application specific integrated circuit (ASIC), a field-programmable gate array (FPGA), and a digital signal processor (DSP), and the like. In one embodiment, the control system 100 may be implemented as part of a controller 144 as shown in FIG. 1. In some embodiments, the controller 144 may be a dedicated controller. In others, the control system 100 may include a plurality of controllers that are in communication with one another and other components of the control system 100 to implement the operations described herein.

Hereinbelow the block diagram of FIG. 4 which executes the control functionality according to the present disclosure will be described. While the following makes reference to various controllers, in certain embodiments, each controller may comprise a series of stored instructions that are executed by the CPU of controller 144 to perform the described functions. In other embodiments, each controller described herein may be embodied as individual integrated circuits each with their own CPUs and memories and are dedicated to performing the processing associated therewith. In other embodiments, one or more of the controllers described herein may be embodied as a single integrated circuit. Further, in some embodiments, some of the described controllers may be dedicated processing units and be in communication with the CPU of the controller which is executing stored instructions to complete the function operations described herein.

FIG. 4 includes the sensor 158, a feedforward controller 410, an alignment feedback controller 430 ($K_1$), a stage feedback controller ($K_2$) 450 and a stage amplifier 470 (hereinafter referred to as "amplifier 470"). Positioned between the above described components are a plurality of junctions which merge signals output by the respective controllers that feed them by adding, subtracting, or convoluting each other. Each of the above components operate as described hereinbelow in order to cause the stage supporting the substrate to move to a target position that represents an alignment error value within a predetermined alignment error range. Each of the alignment feedback controller 430 and the stage feedback controller 450 may execute as a proportional-integral-derivative (PID) controller or any other feedback controller. The control function executed by the feedback controllers is known and need not further be described and continually calculates error values based on the inputs received therein. A first junction 420 is positioned between the feedforward controller 410 and the sensor 158 and generates a first input signal 422 to the alignment feedback controller 430 which represents a feedback control error ($e_1$) using a first feedforward control signal 412 ($f_1$) representing alignment reference trajectory and a measurement signal 402 ($y_1$) that represents the position of the mark on the template relative to the mark on the substrate. The first feedforward signal 412 ($f_1$) represents alignment reference trajectory information and is generated based on the measurement signal 402 and reference trajectory information stored in a memory. Using the first input signal $e_1$ the alignment controller 430 can generate an alignment trajectory ($u_1$) (sometimes referred to as a control command or control effort) that will be used in aligning the marks on the substrate and template more quickly. The alignment controller 430 outputs the alignment trajectory information 432 ($u_1$) as an input to a second junction 440.

The feedforward controller 410 further outputs a second feedforward control signal 414 ($f_2$) to the second junction 440. The second feedforward control signal 414 ($f_2$) may be the same as the first feedforward signal 412 ($f_1$) or it may be a shifted version thereof (e.g. time shifted, phase shifted, magnitude shifted, etc.). In addition to the alignment trajectory information 432 and the second feedforward signal 414, the second junction 440 receives, as an input, stage position information 474 ($y_2$) that is obtained from a stage position sensor 476 of the amplifier 470. The stage position information 474 represents a current measured position of the stage 106 at the conclusion of a stage movement operation requested by the amplifier 470. These signals are combined to generate a second input signal 442 ($e_2$) which represents the error rate of the stage feedback controller 450 ($K_2$). The stage feedback controller 450 ($K_2$) generates a control effort representing stage trajectory information 452 ($u_2$) as an output therefrom. While the stage position sensor 476 is shown separate from the stage 106, this is merely exemplary and shown to facilitate understanding of system operation. It should be understood that the stage position sensor 476 may be included in the stage 106. The stage feedback controller 450 continually calculates the error value associated with a position of the stage 106 as controlled by the amplifier 470.

A third junction 460 is disposed between the stage feedback controller 450 ($K_2$) and the stage amplifier 470. The third junction 460 combines the stage trajectory information 452 ($u_2$) with a third feedforward signal 416 ($f_3$) generated and output by the feedforward controller 410. The third feedforward signal 416 ($f_3$) is a motion control command prediction signal and the third junction 460 combines this with the stage trajectory information 452 ($u_2$) to generate the stage motion control signal 462 which is translated by stage amplifier 470 into a voltage or current (output control signal 472) that is used to drive the stage 106 in the defined manner.

Additional information further defining how each of the above described input and output signals of each of the feedforward controller 410, the alignment feedback controller 430 and stage feedback controller 450 and the benefits applicable to the alignment processing can be found in the description of U.S. patent application Ser. No. 16/712,739, the description of which is incorporated herein by reference in its entirety.

Figure 5:
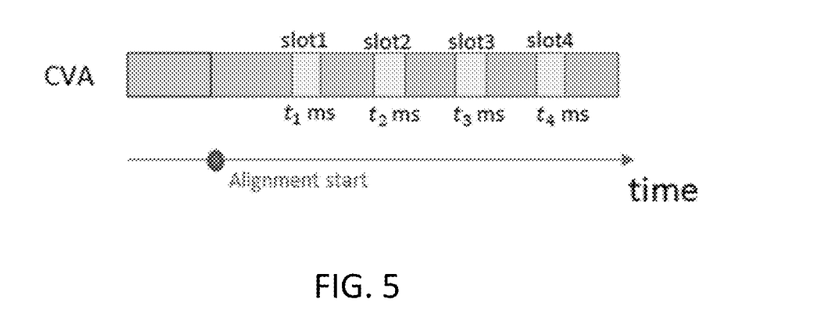
FIG. 5 illustrates the controlled viscosity alignment operation.

FIG. 4 further illustrates an energy controller 401 that controls the energy source 138 during controlled viscosity alignment (CVA). During CVA, after the polymerizable material is deposited on the substrate, energy having a predetermined intensity for a predetermined duration is directed towards the substrate to increase the viscosity of the polymerizable material during alignment of the mark on each of the substrate and template. In one exemplary operation, a plurality of energy application periods occur where, in each period, energy of the predetermined intensity is applied for the duration of the period. Exemplary operation of the timing of the CVA process is illustrated in FIG. 5. As shown therein, the plurality of energy application periods are illustrated as "slot1" which begins at $t_1$ and has a predetermined duration, "slot2" which begins at $t_2$ and has a predetermined duration, "slot3" which begins at $t_3$ and has a predetermined duration, and "slot4" which begins at $t_4$ and has a predetermined duration. In one embodiment, the duration of each energy application period is the same. In another embodiment, certain of the energy application periods have a same duration while other have different durations. In a further embodiment, the duration of each successive energy application is less than the immediately preceding energy application period. In another embodiment, the duration of each successive energy application is greater than the immediately preceding energy application period. In another embodiment, the spatial distribution of energy supplied changes with during each slot. In another embodiment, additional energy of a different wavelength and intensity is supplied after CVA to further cure the polymerizable material.

The CVA process is advantageous in that by increasing the viscosity of the polymerizable material deposited onto the substrate traditional vibration associated with the alignment processing whereby the mark on the substrate is brought into alignment with the mark on a template within an acceptable period of time. However, the result of the CVA process is other different vibration that could further impact the alignment. For example, each time CVA is applied to a particular field on the substrate, the magnitude, frequency, and/or phase of vibration that is introduced into the system may differ. As such, it is difficult to correct for this secondary vibration that may differ in frequency and amount after imprinting on successive fields of the substrates. In order to compensate for this secondary vibration, the control system of FIG. 4 further includes a calibration controller 405 that continually calculates calibration parameters based on historical input and output values as well as current, real-time input and output values to adapt the learning rate used to generate an adaptive vibration cancellation parameter applied to each of the feedforward controller 410, alignment feedback controller 430 and stage feedback controller 450 as will be discussed below.

The calibration controller 405 generates at least one calibration matrix that is a multiple input and multiple output (MIMO) matrix based on moving a time window transfer function and covariance. The MIMO matrix takes, as inputs the following signals as shown in Table 1:

TABLE 1

Input Signals for Calibration Matrix $y_1$: Position Signal 402 sensed by sensor 158 that represents a relative position of the mark on the template to the position of the mark on the substrate
$y_2$: Position signal 474 sensed by stage position sensor 476 representing a last position of the stage at the completion of the most recent alignment action
$u_1$: Control signal output from the alignment feedback controller 430 representing alignment trajectory information
$u_2$: control signal output from the Stage Feedback Controller 450 representing stage trajectory information
$f_1$: First feedforward control signal input to the alignment feedback controller 430
$f_2$: Second feedforward control signal input to the Stage Feedback Controller 450
$f_3$: Third feedforward control signal input to the amplifier 470
$e_1$: error value derived from most recent alignment operation and input to alignment feedback controller 430
$e_2$: error value derived from most recent alignment operation and input to Stage encoder feedback controller 450
Historical data values representing each of the above inputs The calibration matrix generated by the calibration controller 405 is used to selectively modify the adaptive feedforward learning rate that is used to generate adaptive functions that are applied to other controllers 410, 430 and 450 in order to adjust the parameters of the feedback loop to better correct for vibration introduced by the CVA process. The adaptive functions are generated using real-time sensed information and offline historical alignment data from previously performed imprint lithography processes. By using the types of multiple input values the calibration controller 405 can improve the adjustment to adaptive learning rates and the resulting adaptive functions derived using the adjusted adaptive learning rates. The adaptive functions represent vibration (e.g. noise) cancellation signals that are active cancellation inputs provided to each of the feedforward controller 410, alignment feedback controller 430 and the stage feedback controller 450 which make use of these cancellation signals when generating their respective output signals as noted above to actively cancel vibration resulting from the CVA process. The adjustments to the adaptive learning rates and resulting adaptive functions are generated not only using the individual inputs discussed above but also considering the interaction of the different inputs listed above such as by calculating the covariance between various calibration controller inputs. By considering the interrelation of one or more of the calibration controller inputs, more accurate and robust vibration correction can occur. An exemplary calibration matrix visualizing the input signals and their relationship are shown in Table 2. For each relationship listed below, the calibration matrix calculates the relationship over a moving time window and also a covariance between the signals. The covariance is a measure of the joint variability of two signals.

TABLE 2

Exemplary Calibration Matrix

|  | Mark Position Signal (MPS) | Stage Position Signal (SPS) |
| --- | --- | --- |
| CVA | CVA-MPS | CVA-SPS |
| Adaptive Function (AdaptFF) | AdaptFF-MPS | AdaptFF-SPS |
| Stage Motion Control Signal | Stage Motion-MPS | Stage Motion-SPS |

For example, the calibration controller 405 generates an initial calibration matrix including current real-time inputs and historical input values of prior conducted imprints at the time CVA processing begins and the viscosity of the polymerizable material is increased. Because the sample rate of the control loop of FIG. 4 is shorter than a single CVA application, the control loop is able to sense and continually calculate and monitor the different multiple inputs as noted above. Once CVA has started friction increases and vibration is reduced. If this was the only vibration, then the adaptive functions generated and applied to the controllers should also be reduced. However, the change occurring due to CVA occurs over time and does not have a uniform distribution in terms of time, peak frequencies and friction levels. As such, the transition from CVA to UV application is not robust and the alignment error is randomly distributed instead of closing towards zero. The generated calibration matrix advantageously predicts the impact and transition of the CVA process such that the adaptive functions generated therefrom can be used to actively modify how each of the three feedforward signals ($f_1$, $f_2$, $f_3$) are generated by the feedforward controller 410 and how the alignment feedback controller 430 and stage feedback controller 450 use the respective error rates ($e_1$, $e_2$) input thereto with the three feedforward signals ($f_1$, $f_2$, $f_3$) improve the generated control signals ($u_1$, $u_2$) to actively cancel and correct for vibration resulting from the CVA process. The adaptive functions generated by the calibration matrix may include parameters that modify one or more of the magnitude, phase and frequency of control signals to correct for vibration. The calibration matrix is continually calculated and updated to monitor the interaction between various matrix input signals in order to improve the accuracy of the adaptive functions generated and applied throughout the system. For example, when calculating the relationship between the input and output signals, the covariance therebetween is below a threshold covariance, it indicates that the generated adaptive functions reduced the position error during alignment by correcting the vibration that was introduced in the CVA process. If the covariance is above a threshold covariance, the calibration controller 405 modifies the learning rate used to generate the adaptive function by decreasing a weight associated with one or more of the input signals and/or identifying other input signals to use as part of the learning rate to try to minimize the covariance values between the input signals being used. In exemplary illustration, if the control effort for minimizing the vibrations from the CVA process is increased but an error rate is also increased then the covariance will also increase. This is indicative of the control effort being too large. As such, the correction performed is to modify the control gain and/or the learning so that the resulting output signal reduces the control effort.

Figure 6:
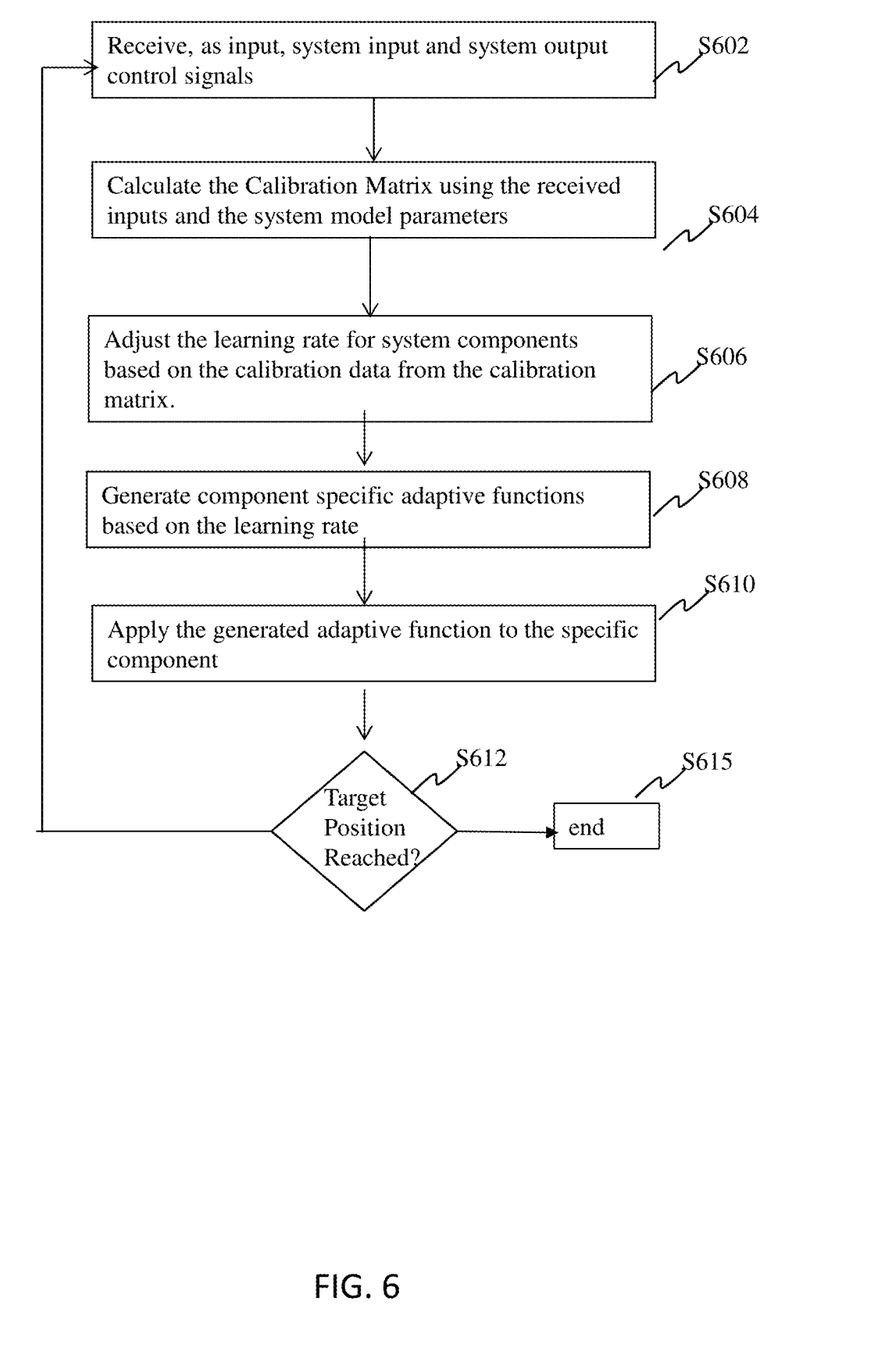
FIG. 6 is a flow diagram detailing an alignment control algorithm.

Turning now to FIG. 6 which shows an exemplary control algorithm performed by the calibration controller 405 and which is applied to the feedforward-feedback alignment control in accordance with the present disclosure. The following description will make use of the reference numerals associated with FIGS. 1-4 to indicate the processing units that perform the algorithmic control. In step S602, the calibration controller receives a plurality of input signals that represent system input control signals and system output control signals. These system input control signals and system output control signals include signals that are used as inputs to and outputs from the feedforward controller 410, the alignment feedback controller 430 and stage feedback controller 450. Additional inputs received in S602 include positional inputs sensed from one or more sensors in the imprint lithography system including, but not limited to a moiré sensor and s stage position sensor. For example, the signals received in S602 include at least those listed in Table 1 above. These input signals received in S602 are continually received according to the sample rate of the feedforward-feedback alignment control system. In another embodiment, the input signals received in S602 include historical input signals. These historical input signals are of the same type as discussed above with the noted exception that they are derived from previously completed imprint processing.

In step S604, the calibration controller uses the received inputs in S602 along with the system model parameters that define which transfer functions are applied throughout the control system to generate the calibration matrix. In generating the calibration matrix in S604, the calibration controller decouples, filters and normalizes the received inputs from S602 such that relationship between one or more of the received inputs can be determined. By determining the relationship between the one or more input signals, the learning rate used to generate adaptive functions that will be applied to various system components is improved to foster quicker alignment of the marks on the substrate and template. An exemplary calibration matrix includes a transfer function matrix as shown in Table 3 illustrating the relationship between the various input signals.

TABLE 3

Transfer Function Matrix $$\begin{bmatrix} y_1 \\ y_2 \end{bmatrix} = \begin{bmatrix} g_{11}(t) & g_{12}(t) \\ g_{21}(t) & g_{22}(t) \end{bmatrix} \begin{bmatrix} u_1 + f_2 \\ u_2 + f_3 \end{bmatrix}$$

$$u_1 = K_1 e_1 = K_1 (f_1 - y_1)$$
$$u_2 = K_2 e_2 = K_2 (f_2 - y_2)$$

$$\begin{bmatrix} f_1 \\ f_2 \\ f_3 \end{bmatrix} = \begin{bmatrix} \psi_{11} & \psi_{12} \\ \psi_{21} & \psi_{22} \\ \psi_{31} & \psi_{32} \end{bmatrix} \begin{bmatrix} y_1 \\ y_2 \end{bmatrix}$$

Where,
K1 represents the alignment feedback controller 430
K2 represents the stage feedback controller 450

$y_1$: Position Signal 402 sensed by sensor 158 that represents a relative position of the mark on the template to the position of the mark on the substrate $y_2$: Position signal 474 sensed by stage position sensor 476 representing a last position of the stage at the completion of the most recent alignment action $u_1$: Control signal output from the alignment feedback controller 430 representing alignment trajectory information $u_2$: control signal output from the Stage Feedback Controller 450 representing stage trajectory information $f_1$: First feedforward control signal input to the alignment feedback controller 430

$f_2$: Second feedforward control signal input to the Stage Feedback Controller 450

$f_3$: Third feedforward control signal input to the amplifier 470

In defining the relationship between $y_1$ with $u_1$ and $f_2$, time variant transfer functions $g_{11}$ and $g_{12}$ are used. As used herein $g_{11}(t)$ represents a time variant transfer function between inputs to the stage feedback controller 450 $u_1+f_2$ and output $y_1$ representing the position signal 402 sensed by sensor 158. Further, $g_{12}(t)$ represents a time variant transfer function between input to the stage amplifier 470 $u_2+f_3$ and output $y_1$ representing the position signal 402 sensed by sensor 158. In defining the relationship between $y_2$ with $u_2$ and $f_3$, time variant transfer functions $g_{21}$ and $g_{22}$ are used. As used herein $g_{21}(t)$ represents time variant transfer function between inputs to the stage feedback controller 450 $u_1+f_2$ and output of the stage motion sensor 476 $y_2$. Further $g_{22}(t)$ represents a time variant transfer function between input to the stage amplifier 470 $u_2+f_3$ and output of the stage motion sensor 476 $y_2$. Further, in defining the relationship between the feedforward control signals $f_1$, $f_2$, and $f_3$ and position signals $y_1$ and $y_2$, the calibration matrix considers the control parameters of the feedforward controller 410 where $\psi_{11}$ is feedforward controller for $f_1$ based on $y_1$; $\psi_{12}$ represents feedforward controller for $f_1$ based on $y_2$; $\psi_{21}$ represents feedforward controller for $f_2$ based on $y_1$; $\psi_{22}$ represents feedforward controller for $f_2$ based on $y_2$; $\psi_{31}$ represents feedforward controller for $f_3$ based on $y_1$; $\psi_{32}$ represents feedforward controller for $f_3$ based on $y_2$.

The calibration matrix generated in S604 also includes a covariance matrix which identifies a variance ratio between input signals. An exemplary covariance matrix is shown in Table 4 below:

TABLE 4

Covariance Matrix $$\text{cov}(\epsilon, Y) = E[(\epsilon - E[\epsilon])(Y - E[Y])]$$

$$\epsilon = \begin{bmatrix} e_1 \\ e_2 \\ f_3 \end{bmatrix}$$

$$Y = \begin{bmatrix} y_1 \\ y_2 \end{bmatrix}$$

Where, $y_1$: Position Signal 402 sensed by sensor 158 that represents a relative position of the mark on the template to the position of the mark on the substrate $y_2$: Position signal 474 sensed by stage position sensor 476 representing a last position of the stage at the completion of the most recent alignment action $f_3$: Third feedforward control signal input to the amplifier 470

$e_1$: error value derived from most recent alignment operation and input to alignment feedback controller 430

$e_2$: error value derived from most recent alignment operation and input Stage encoder feedback controller 450

E[ ]: is expected value of anything in the brackets. This may be implemented as a weighted average calculated over a moving time window.

S604 further includes the decoupling of these input signals such that the system is able to configure parameters to be applied to the individual system controllers in order to achieve the desired effect of correcting for vibration introduced during the CVA process. When the transfer function matrix in Table 3 is decoupled, we obtain the following:

$$y_1 = G_1(K_1 e_1)$$

$$y_2 = G_2(K_2 e_2)$$

Where, $G_i$ is the transfer function that represents the relationship between detected errors ($e_1$) and sensed position signals ($y_i$).

Further, when the covariance matrix is decoupled, we obtain the following:

$$\text{cov}(e_1, u_1)$$

$$\text{cov}(e_2, u_2)$$

$$\text{cov}(f_3, e_2)$$

In so doing, we obtain the covariance value between alignment control feedback error $e_1$ and control signal $u_1$ generated by the alignment feedback controller 430, the covariance value between stage control feedback error $e_2$ and control signal $u_2$ generated by the alignment feedback controller 430, and the covariance value between feedforward control signal $f_3$ and stage control feedback error $e_2$.

In step S606, the calibration controller 405 adjusts the learning rate associated with respective system components. In operation, the decoupled covariance matrix is used to adapt the learning rate used for generating the adaptive function that will be applied to the system components to provide a control parameter to inject active vibration cancelation into the alignment process that utilizes CVA alignment processing. The learning rate for the adaptive function to be applied to the alignment feedback controller 430 is adjusted according to the following equation:

$$\rho_{K1} = \rho_{K1} - \beta_1 \{\text{cov}(e_1, u_1)\}$$

Where $\rho_{K1}$ represents the learning rate for adaptive function, targeting on $K_1$ and $\#_1$ represents the learning rate adjusting constant or function. The learning rate for the adaptive function to be applied to the stage feedback controller is adjusted according to the following equation:

$$\rho_{K2} = \rho_{K2} - \beta_2 \{\text{cov}(e_2, u_2)\}$$

Where $\rho_{K2}$ represents the learning rate for adaptive function, targeting on $K_2$ and $\#\beta_2$ represents the learning rate adjusting constant or function. Finally the learning rate for the adaptive function to be applied to the feedforward controller 410 is adjusted according to the following equation:

$$\rho_{32} = \rho_{32} - \beta_2 \{\text{cov}(f_3, e_2)\}$$

Where $\rho_{32}$ represents the learning rate for adaptive function, targeting on the feed forward controller 410 and $\beta_{32}$ represents the learning rate adjusting constant or function.

Using the learning rates generated in S606, the component specific adaptive functions can be generated. A first adaptive function is applied to the feedforward controller 410 generated using the decoupled transfer function matrix in Table 3 in accordance with the following equation:

$$\Delta\psi_{32} = \rho_{32}\psi_{32}(f_3, e_2)$$

Wherein $\Delta\psi_{32}$ represents a change in control parameter being applied, $\rho_{32}$ represents the learning rate for adaptive function and $\psi_{32}$ represents the adaptive function for feedforward controller $\psi_{32}$. A second adaptive function is generated and is applied to the alignment feedback controller 430 according to the following equation $$\Delta K_1 = \rho_{K1}\Theta_1(e_1, u_1)$$

Where $\Delta K_1$ represents the change applied to the alignment feedback controller 430, $\rho_{K1}$ represents the learning rate applied to the controller 430 and $\Theta_1$ represents the adaptive function for $K_1$. A third adaptive function is generated and is applied to the stage feedback controller 430 according to the following equation $$\Delta K_2 = \rho_{K2}\Theta_2(e_2, u_2)$$

Where $\Delta K_2$ represents the change applied to the stage feedback controller 450, $\rho_{K2}$ represents the learning rate applied to the controller 450 and $\Theta_2$ represents the adaptive function for $K_2$.

Turning back to FIG. 4, at each sample time according to the sample rate of the system described herein, the learning rate is continually adjusted in S606 in order to continually update component specific adaptive functions that actively contribute to canceling noise introduced during the controlled viscosity alignment process. These updated component specific adaptive functions are applied in S610. At each sample, the first adaptive function 406 is applied to the feedforward controller 410 used by the feedforward controller 410 when generating the first, second and third feedforward control signals $f_1$, $f_2$ and $f_3$. The second adaptive function is applied to the alignment feedback controller 430 and is used thereby, in addition to its regular inputs as discussed above, to generate the control signal $u_1$. The third adaptive function is applied to the stage feedback controller 450 and used thereby in addition to its regular inputs to generate control signal $u_2$.

In step S610, an output control signal 472 is provided to the amplifier 470 which controls the moveable stage to approach the target position based on the generated output signal. A determination is made by the sensor 158 as to whether an error value associated with the relative position of the mark on the substrate and the mark on the template are within a predetermined error range. If the result of the determination in S613 is positive indicating that the error value is within an acceptable range, the determination is indicative that the mark on the template and the mark on the substrate are aligned with one another and the control algorithm ends in S613.

Therefore, the control algorithm detailed hereinabove can be used in a process for semiconductor manufacturing to manufacture one or more articles or devices. These processes for subjecting the substrate which has been successful aligned in accordance with the control algorithm described herein above include but are not limited to: imprint lithography; photolithography; baking; oxidation; layer formation; deposition; doping; etching; descumming; dicing; bonding; packaging; etc. The substrate can be further processed using other known steps and processes for article fabrication, including, for example, inspection, curing, oxidation, layer formation, deposition, doping, planarization, etching, formable material removal, dicing, bonding, packaging, and the like. Based on the above, the substrate may be processed to produce a plurality of articles (devices).

In one example, the processing may include dispensing an imprint resist (e.g. a liquid) on the substrate and contacting the imprint resist with the object such that object, which has a pattern thereon, contacts the imprint resist. The processing includes alignment processing to align the substrate and object (e.g. template) to a predetermined alignment position and then processing the substrate on which the imprint resist has been dispensed so as to manufacture the articles. In so doing energy is applied to the substrate to cure the resist and form a pattern on the substrate that corresponds to the pattern on the template. This process is repeatedly performed such that the object and substrate are aligned prior to the resist being cured by the applied energy.

A number of implementations have been described. Nevertheless, it will be understood that various modifications may be made without departing from the spirit and scope of the disclosure. Accordingly, other implementations are within the scope of the following claims.

An embodiment of the present disclosure can be carried out by providing a program implementing one or more functions of the above-described embodiment to a system or apparatus via a network or storage medium and reading and executing the program with one or more processors in a computer of the system or apparatus. Also, an embodiment of the present disclosure can be carried out by a circuit implementing one or more functions (for example, an application specific integrated circuit (ASIC)).

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In referring to the description, specific details are set forth in order to provide a thorough understanding of the examples disclosed. In other instances, well-known methods, procedures, components, and circuits have not been described in detail as not to unnecessarily lengthen the present disclosure.

It should be understood that if an element or part is referred herein as being "on", "against", "connected to", or "coupled to" another element or part, then it may be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90° or at other orientations) and the spatially relative descriptors used herein are to be interpreted accordingly. Similarly, the relative spatial terms "proximal" and "distal" may also be interchangeable, where applicable.

The term "about," as used herein means, for example, within 10%, within 5%, or less. In some embodiments, the term "about" may mean within measurement error.

The terms first, second, third, etc. may be used herein to describe various elements, components, regions, parts and/or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated.

The foregoing merely illustrates the principles of the disclosure. Various modifications and alterations to the described exemplary embodiments will be apparent to those skilled in the art in view of the teachings herein.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

We claim:

1. An imprint lithography system for controlling alignment of an imprint lithography template with respect to a substrate, the system comprising:
a stage configured to retain the substrate and which is moveable such that a position of the stage can be modified; and
a depositor configured to deposit resist on the substrate;
an energy controller configured to apply energy to the resist to increase viscosity thereof;
a sensor configured to sense a position of the substrate relative to the imprint lithography template; and
at least a controller in communication with the stage and the sensor configured to, based on the substrate having a liquid imprint resist contacting the template:
align the substrate with the template in contact via the resist using a feedback-feedforward control process with a first set of control parameters;
increase the viscosity of at least a portion of the resist between the substrate and the template;
obtain calibration data that reduces vibration caused by the process of increasing the viscosity of at least the portion of the resist, among the vibrations that occur when aligning the substrate to the template, the calibration data being obtained based on at least the first set of control parameters and historical control parameters obtained from previously performed imprint processing;
align the substrate with the template in contact via the resist using the feedback-feedforward control process with a second set of control parameters after the viscosity of the resist has increased, wherein the second set of control parameters are determined based on the calibration data; and
cure the resist between the substrate and the template after the substrate is aligned to the template.

2. The system of claim 1, wherein the at least one controller is further configured to generate the calibration data while aligning the substrate with the template using the feedback-feedforward control process with the first set of control parameters.

3. The system of claim 1, wherein the at least one controller is further configured to generate the calibration data by:
receiving a set of alignment controls that vary with time;
transforming the set of alignment controls into a set of alignment state values that vary with a first state variable;
receiving a set of position estimations that vary with time;
transforming the set of position estimations into a set of position state values that vary with the first state variable; and
generating one or more covariance values.

4. The system of claim 3, wherein the set of alignment controls include (a) one or more adaptive functions used in the feedback-feedforward control process; (b) one or more output control signals used in controlling the position of the stage; and (c) an energy controller signal controlling one or more parameters of the energy being applied to increase the viscosity of the resist.

5. The system of claim 3, wherein the set of position estimations includes a first position signal representing a mark on the template relative to a mark on the substrate and a second position signal representing a position of the stage.

6. The system of claim 3, wherein generating the calibration data further comprises obtaining a second set of alignment controls and a second set of position estimations, wherein the second set of alignment controls and the second set of position estimations are based on previously performed imprint processes.

7. The system of claim 3, wherein the generated covariance values are used to generate the second set of control parameters by modifying one or more control functions applied during the feedback-feedforward control process.

8. The system according to claim 1, wherein the first set of control parameters include a frequency component and the second set of control parameters represent an updated frequency component generated based on the calibration data and a change in frequency that occurs after increasing the viscosity of at least a portion of the resist, and further comprising aligning the substrate with the template based on the updated frequency component in the second set of control parameters.

\* \* \* \* \*